United States Patent
Tsao et al.

(10) Patent No.: US 12,046,474 B2
(45) Date of Patent: Jul. 23, 2024

(54) WAFER AND MANUFACTURING METHOD OF WAFER

(71) Applicant: GlobalWafers Co., Ltd., Hsinchu (TW)

(72) Inventors: Chenghan Tsao, Hsinchu (TW); Han-Zong Wu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 69 days.

(21) Appl. No.: 17/670,510

(22) Filed: Feb. 14, 2022

(65) Prior Publication Data

US 2023/0011749 A1 Jan. 12, 2023

(30) Foreign Application Priority Data

Jul. 8, 2021 (TW) .................................. 110125092

(51) Int. Cl.
*H01L 21/266* (2006.01)
*H01L 21/265* (2006.01)
*H01L 29/36* (2006.01)

(52) U.S. Cl.
CPC ........ *H01L 21/266* (2013.01); *H01L 21/2652* (2013.01); *H01L 29/36* (2013.01)

(58) Field of Classification Search
None
See application file for complete search history.

(56) References Cited

U.S. PATENT DOCUMENTS

| | | | | |
|---|---|---|---|---|
| 4,963,501 A | * | 10/1990 | Ryan | ................. H01L 21/28587 257/280 |
| 2015/0145105 A1 | | 5/2015 | Haapalinna | |
| 2016/0372484 A1 | | 12/2016 | Nguyen et al. | |
| 2019/0372243 A1 | | 12/2019 | Desbonnets et al. | |

FOREIGN PATENT DOCUMENTS

TW 201803015 1/2018

OTHER PUBLICATIONS

Wen et al, CN 109801914, An Etch stop Layer between the Substrate and Isolation Layer, May 24, 2019 (Year: 2019).*

* cited by examiner

*Primary Examiner* — Alexander G Ghyka
(74) *Attorney, Agent, or Firm* — JCIPRNET

(57) ABSTRACT

A wafer includes a semiconductor substrate. The semiconductor substrate includes a plurality of first doped regions and a plurality of second doped regions. The first doped regions and the second doped regions are located on a first surface of the semiconductor substrate. The second doped regions contact the first doped regions. The first doped regions and the second doped regions are alternately arranged. Both of the first doped regions and the second doped regions include a plurality of N-type dopants. The doping concentration of the N-type dopants in each of the first doped regions is not greater than the doping concentration of the N-type dopants in each of the second doped regions.

10 Claims, 17 Drawing Sheets

WAFER AND MANUFACTURING METHOD OF WAFER

CROSS-REFERENCE TO RELATED APPLICATION

This application claims the priority benefits of Taiwan application serial no. 110125092, filed on Jul. 8, 2021. The entirety of the above-mentioned patent application is hereby incorporated by reference herein and made a part of this specification.

BACKGROUND

Technical Field

The disclosure relates to a wafer and a manufacturing method thereof.

Description of Related Art

Generally speaking, a communication device needs to be equipped with a chip for processing high-frequency electromagnetic waves, such as a radio frequency chip (RF). The RF chips are the core components of many communication devices. Presently, many manufacturers have devoted themselves to the research and development of RF chips, in order to obtain RF chips with better functions and lower costs. Common RF chips are manufactured using the semiconductor process. The RF chips are obtained by arranging various components in and on the semiconductor substrate. However, if the conductivity of the semiconductor substrate is too high, it is easy to adversely affect the signals generated or received by the RF chips.

SUMMARY

The present invention provides a wafer that can improve the problem that elements in an epitaxial layer diffuse into a semiconductor substrate and cause insufficient semiconductor resistance.

The present invention provides a manufacturing method of a wafer, which can improve the problem that the elements in the epitaxial layer diffuse into the semiconductor substrate and cause insufficient semiconductor resistance value.

At least one embodiment of the present invention provides a wafer, including a semiconductor substrate. The semiconductor substrate includes: first doped regions and second doped regions. The first doped regions and the second doped regions are located on a first surface of the semiconductor substrate. The second doped regions are in contact with the first doped regions. The first doped regions and the second doped regions are alternately arranged. Both of the first doped regions and the second doped regions include N-type dopants. A doping concentration of the N-type dopants in each of the first doped regions is not greater than a doping concentration of the N-type dopants in each of the second doped regions.

At least one embodiment of the present invention provides a manufacturing method of a wafer, including: providing a semiconductor substrate; performing a first ion implantation process on a first surface of the semiconductor substrate to form an N-type lightly doped region in the semiconductor substrate; forming a barrier layer on the first surface of the semiconductor substrate, and the barrier layer has openings exposing N-type lightly doped region; using the barrier layer as a mask to perform a second ion implantation process on the N-type lightly doped region of the semiconductor substrate to form first N-type doped regions and second N-type doped regions, wherein the first N-type doped regions and the second N-type doped regions are in contact with each other, wherein the first N-type doped regions and the second N-type doped regions are arranged alternately, wherein the first N-type doped regions and the second N-type doped regions include N-type dopants, and a doping concentration of the N-type dopants in each of the first N-type doped regions is not greater than a doping concentration of the N-type dopants in each of second N-type doped regions.

At least one embodiment of the present invention provides a manufacturing method of a wafer, including: providing a semiconductor substrate; forming a barrier layer on a first surface of the semiconductor substrate, and the barrier layer has openings exposing the first surface; forming an N-type doping material layer on the barrier layer and in the openings; heating the N-type doping material layer to drive N-type dopants in the N-type doping material layer diffusing into the semiconductor substrate, wherein: part of the N-type dopants diffuse into the semiconductor substrate from the N-type doping material layer after passing through the barrier layer to define first N-type doped regions; and another part of the N-type dopants directly diffuse into the semiconductor substrate from the N-type doping material layer to define second N-type doped regions, wherein the first N-type doped regions and the second N-type doped regions are arranged alternately, wherein both of the first N-type doped regions and the second N-type doped regions include the N-type dopants, and a doping concentration of the N-type dopants in each of the first N-type doped regions is not greater than a doping concentration of the N-type dopants in each of second N-type doped regions.

DESCRIPTION OF THE EMBODIMENTS

FIG. 1A to FIG. 1F are schematic cross-sectional views of a manufacturing method of a wafer according to an embodiment of the present invention.

Figure 1A:
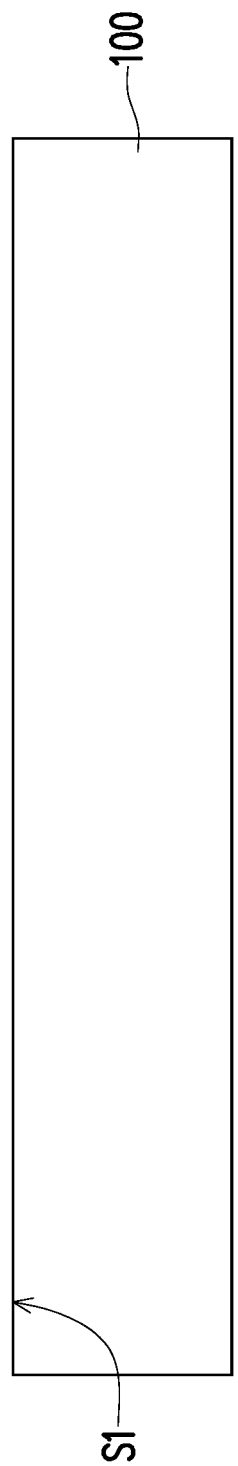
FIG. 1A to FIG. 1F are schematic cross-sectional views of a manufacturing method of a wafer according to an embodiment of the present invention.

Referring to FIG. 1A, a semiconductor substrate 100 is provided. The semiconductor substrate 100 is, for example, a silicon substrate or other semiconductor substrates suitable for an epitaxial process. In some embodiments, a first surface S1 of the semiconductor substrate 100 is a ground and polished flat surface, thereby improving the yield of subsequent processes.

In some embodiments, the semiconductor substrate 100 may be formed by floating zone melting process, Czochralski process, or other suitable process. The resistivity of the semiconductor substrate 100 before performing the ion implantation process is 1500 Ωcm to 10000 Ωcm.

Figure 1B:
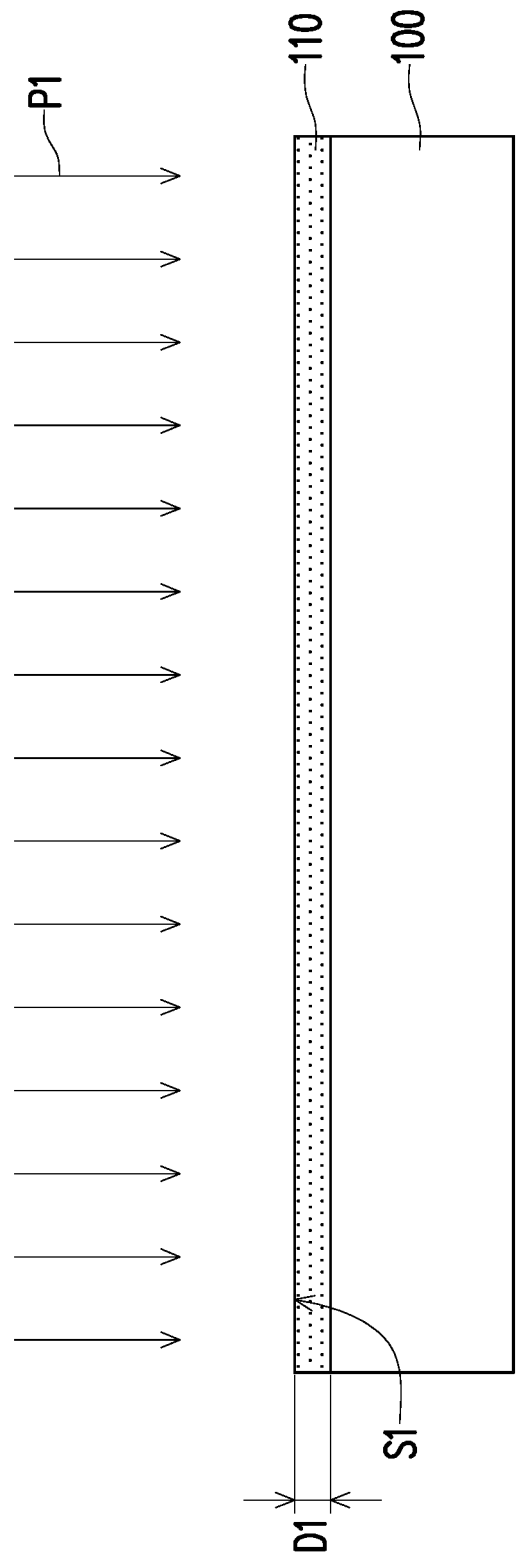

Referring to FIG. 1B, a first ion implantation process P1 is performed on the first surface S1 of the semiconductor substrate 100 to form an N-type lightly doped region 110 in the semiconductor substrate 100. In some embodiments, the first ion implantation process P1 is performed to form an N-type lightly doped region 110 with a depth D1 of 0.1 μm to 5 μm on the first surface S1. In some embodiments, the N-type dopant used in the first ion implantation process P1 includes phosphorus (P), arsenic (As), antimony (Sb), or other suitable elements. In some embodiments, the doping concentration of the N-type lightly doped region 110 is $10^{13}$ cm$^{-3}$ to $10^{17}$ cm$^{-3}$.

In this embodiment, the N-type lightly doped region 110 is formed on the entire first surface S1 of the semiconductor substrate 100, but the present invention is not limited thereto. In other embodiments, the N-type lightly doped region 110 is formed only in a part area of the first surface S1 of the semiconductor substrate 100. In other words, in other embodiments, before the first ion implantation process P1 is performed, a mask layer is formed on the first surface S1 so that the N-type lightly doped region 110 is not formed on the entire first surface S1.

In the present embodiment, the semiconductor substrate 100 is doped with N-type dopants by an ion implanter to form the N-type lightly doped region 110, but the present invention is not limited thereto. In other embodiments, the N-type lightly doped region 110 is formed by thermal diffusion process or other suitable methods.

Figure 1C:
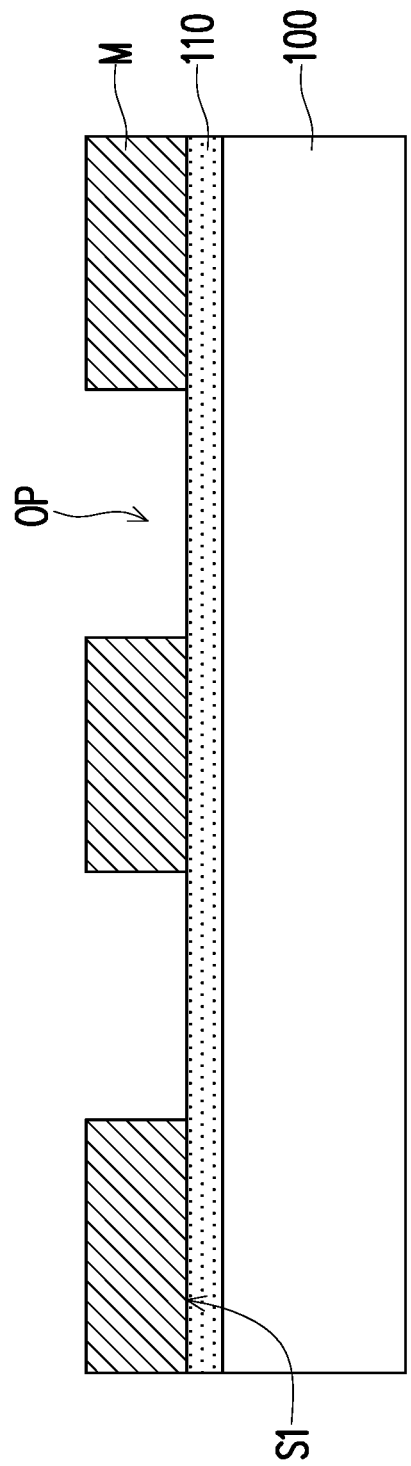

Referring to FIG. 1C, a barrier layer M is formed on the first surface S1 of the semiconductor substrate 100, and the barrier layer M has a plurality of openings OP exposing the N-type lightly doped region 110. The openings OP and the solid part of barrier layer M are staggered.

In some embodiments, the method for forming the barrier layer M includes a lithography process, and the material of the barrier layer M includes a cured photoresist, but the present invention is not limited thereto.

The shape of the vertical projection of the opening OP on the first surface S1 can be adjusted according to requirements. For example, the shape of the vertical projection of the opening OP on the first surface S1 is a triangle, a quadrangle or other geometric shapes.

In this embodiment, the barrier layer M includes a plurality of openings OP with the same size and the same shape, but the present invention is not limited thereto. In some embodiments, the barrier layer M includes multiple openings OP with different sizes and different shapes.

Figure 1D:
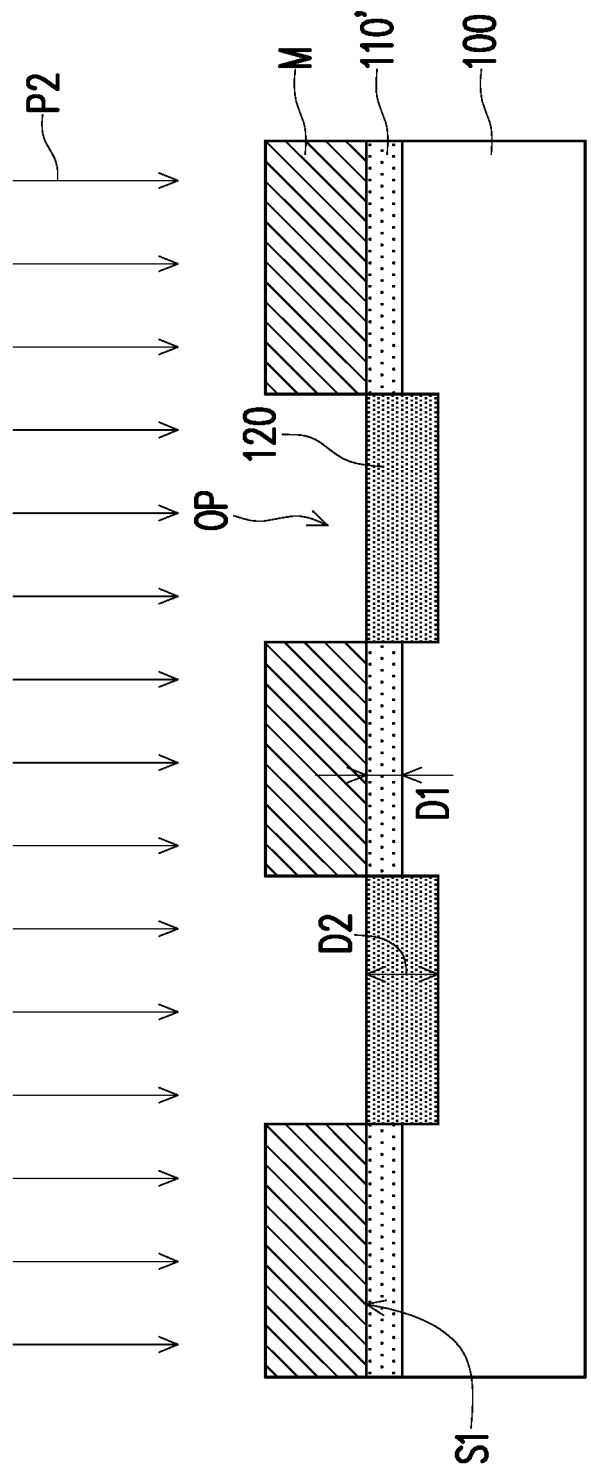

Referring to FIG. 1D, using the barrier layer M as a mask, a second ion implantation process P2 is performed on the N-type lightly doped region 110 of the semiconductor substrate 100 to form a plurality of first N-type doped regions 110' and a plurality of second N-type doped regions 120, wherein the first N-type doped regions 110' and the second N-type doped regions 120 are in contact with each other. The first N-type doped regions 110' are overlapping with the barrier layer M, and the second N-type doped regions 120 are located below the openings OP. The first N-type doped regions 110' and the second N-type doped regions 120 are alternately arranged.

Both of the first N-type doped regions 110' and the second N-type doped regions 120 include N-type dopants. In some embodiments, the N-type dopants used in the second ion implantation process P2 includes phosphorus, arsenic, antimony, or other suitable elements. In some embodiments, the N-type dopants used in the first ion implantation process P1 is the same as the N-type dopants used in the second ion implantation process P2. In some embodiments, both of the first N-type doped regions 110' and the second N-type doped region 120 are N-type semiconductors.

The doping concentration of the N-type dopants in each of the first N-type doped regions 110' is not greater than the doping concentration of the N-type dopants in each of the second N-type doped regions 120. In some embodiments, the doping concentration of the first N-type doped regions 110' is $10^{13}$ cm$^{-3}$ to $10^{17}$ cm$^{-3}$, preferably $10^{13}$ cm$^{-3}$ to $10^{15}$ cm$^{-3}$, more preferably $10^{13}$ cm$^{-3}$ to $10^{14}$ cm$^{-3}$. In some embodiments, the doping concentration of the second N-type doped regions 120 is $10^{16}$ cm$^{-3}$ to $10^{21}$ cm$^{-3}$, preferably $10^{16}$ cm$^{-3}$ to $10^{19}$ cm$^{-3}$, more preferably $10^{16}$ cm$^{-3}$ to $10^{18}$ cm$^{-3}$.

In some embodiments, the depth D2 of the second N-type doped regions 120 is less than or equal to 10 μm, less than or equal to 2 μm, or less than or equal to 1 μm, and the depth D1 of the first N-type doped regions 110' is 1% to 50% of the depth D2 of the deepest second N-type doped region 120, 1% to 25% of the depth D2 of the deepest second N-type doped region 120, or 1% to 10% of the depth D2 of the deepest second N-type doped region 120.

In the present embodiment, the semiconductor substrate 100 includes the first N-type doped regions 110' with the same depth and the second N-type doped regions 120 with the same depth, but the present invention is not limited thereto. In other embodiments, the semiconductor substrate 100 includes the first N-type doped regions 110' with different depths and the second N-type doped regions 120 with different depths.

In FIG. 1D, the cross-sectional shape of the second N-type doped region 120 is shown as a rectangle, but the present invention is not limited thereto.

Figure 1E:
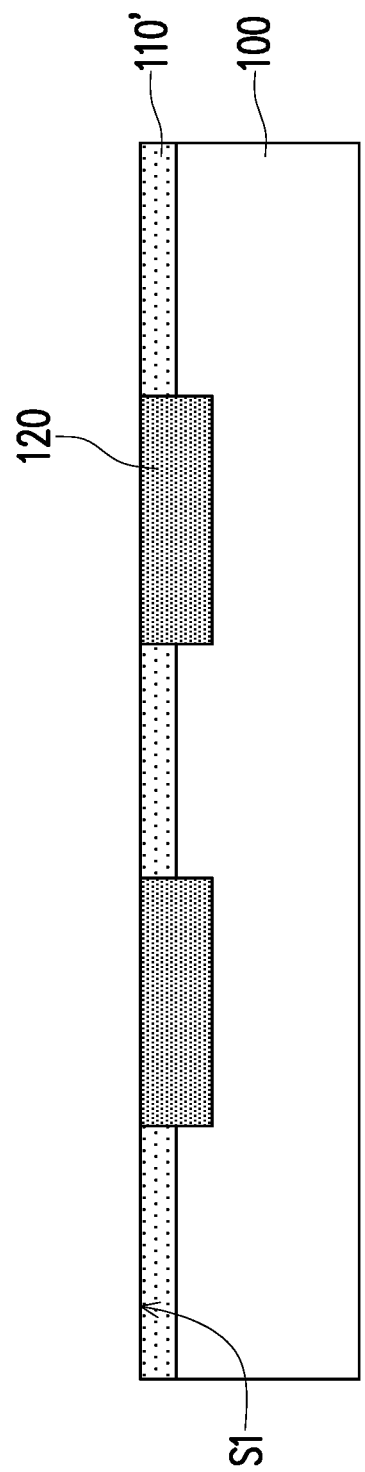
Figure 1F:
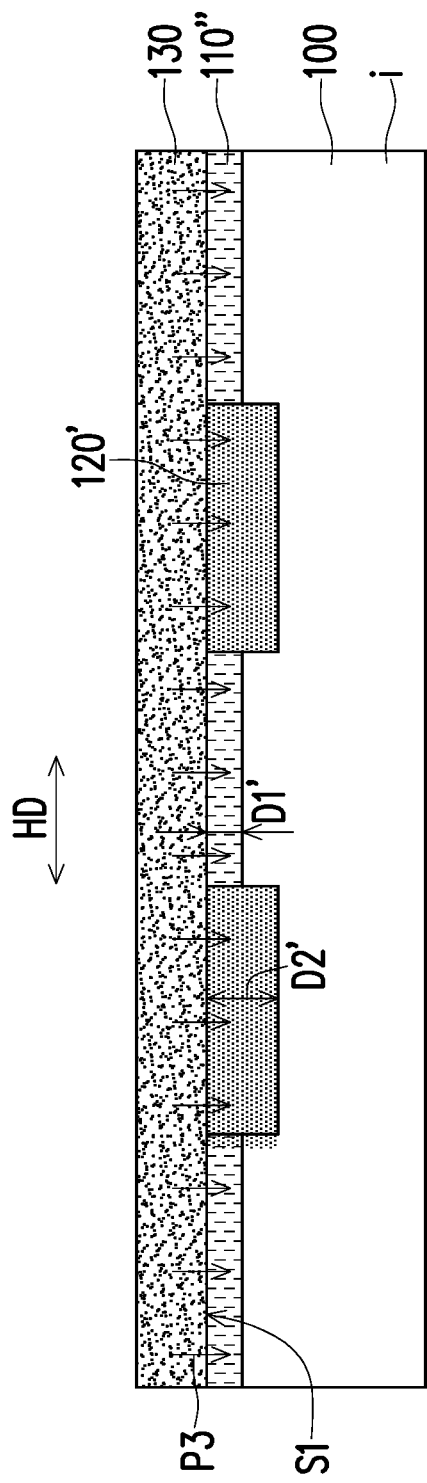

Referring to FIG. 1E and FIG. 1F, the barrier layer M is removed. An epitaxial layer 130 is formed on the first N-type doped regions 110' and the second N-type doped regions 120, and a doping process P3 is performed on the first N-type doped regions 110' and the second N-type doped regions 120. In this embodiment, the material of the epitaxial layer 130 includes gallium nitride, aluminum nitride or other III-V nitride materials or other suitable materials.

The doping process P3 includes driving part of elements (e.g., aluminum element or gallium element) in the epitaxial layer 130 diffusing into the first N-type doped regions 110' and the second N-type doped regions 120, and correspondingly forming the first doped regions 110" and second doped regions 120'.

Figure 6:
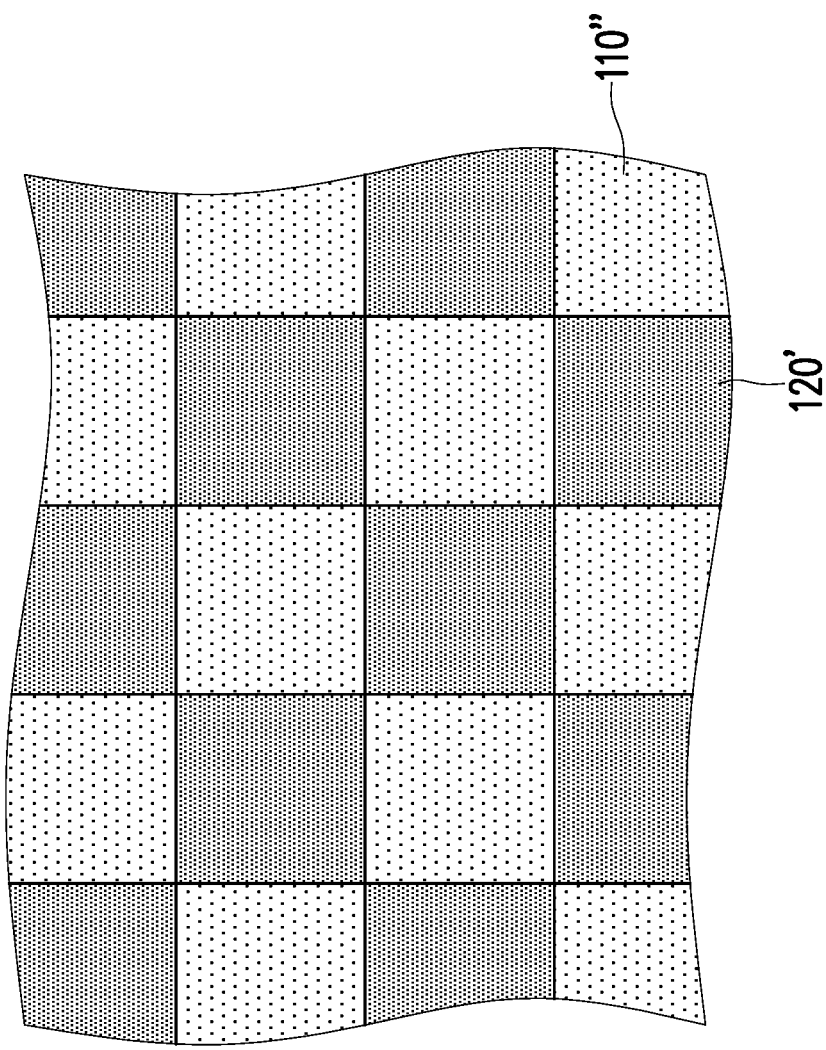
FIG. 6 is a schematic top view of a wafer of an embodiment according to the present invention.

The first doped regions 110" and the second doped regions 120' are located on the first surface S1 of the semiconductor substrate 100, and the second doped regions 120' are in contact with the first doped regions 110". The first doped regions 110" and the second doped regions 120' are alternately arranged. Specifically, in the schematic cross-sectional view of the structure (as shown in FIG. 1F), the side surfaces of each first doped region 110" are adjacent to the second doped regions 120'; in the schematic top view of the structure (as shown in FIG. 6), the edge of the top surface of each first doped region 110" is adjacent to the second doped regions 120'.

In this embodiment, both of the first doped regions 110" and the second doped regions 120' include a plurality of N-type dopants. The aforementioned N-type dopants are formed in the first doped process P1 and the second doped process P2.

In this embodiment, the doping process P3 provides P-type dopants into the first doped regions 110" and the second doped regions 120', and the epitaxial layer 130 contains element the same as the P-type dopants. In this embodiment, the doping concentration of the N-type dopants in each of the first doped regions 110" is not greater than the doping concentration of the N-type dopants in each of the second doped region 120'. In some embodiments, the concentration of the N-type dopants in the first doped regions 110" is substantially equal to the concentration of the N-type dopants in the first N-type doped regions 110', and the concentration of the N-type dopants in second doped regions 120' is substantially equal to the concentration of the N-type dopants in the second N-type doped regions 120.

Since the concentration of the N-type dopants in the first N-type doped regions 110' is not greater than the concentration of N-type dopants in the second N-type doped regions 120, the doping process P3 converts the first N-type doped regions 110' into P type semiconductors, but the doping process P3 does not convert the second N-type doped regions 120 into P-type semiconductors. In the first doped regions 110", the concentration of the P-type dopants is greater than the concentration of the N-type dopants, and the first doped regions 110" are P-type semiconductors. In the second doped regions 120', the concentration of the N-type dopants is greater than the concentration of the P-type dopants, and the second doped regions 120' are N-type semiconductors.

The depth D1' of each of the first doped regions 110" (P-type semiconductors) is not greater than the depth D2' of the adjacent second doped regions 120' (N-type semiconductors). In this embodiment, the N-type dopants in the first N-type doped regions 110' will inhibit the P-type dopants provided by the doping process P3 from going deep into the semiconductor substrate 100. Thereby, the situation that the depth D1' of the first doped regions 110" is greater than the depth D2' of the second doped regions 120' can be avoided to reduce the probability that two first doped regions 110" are in contact with each other. In addition, since the N-type dopants in the first N-type doped regions 110' will inhibit the P-type dopants provided by the doping process P3 from going deep into the semiconductor substrate 100, the depth D2' of the second doped regions 120' does not need to be very thick to block the adjacent first doped regions 110". Therefore, the energy used in the first ion implantation process P1 and the energy used in the second ion implantation process P2 can be reduced, thereby reducing the problem that the first ion implantation process P1 and the second ion implantation process P2 damage the first surface S1 of the semiconductor substrate 100.

In some embodiments, the semiconductor substrate 100 further includes an intrinsic semiconductor region i. The intrinsic semiconductor region i is located under the bottoms of the first doped regions 110" and the second doped regions 120'. In some embodiments, depth D1' is less than depth D2', and second doped regions 120' are in contact with the first doped regions 110" and the intrinsic semiconductor region i in a horizontal direction HD, wherein the horizontal direction HD is parallel to first surface S1.

In FIG. 1F, the cross-sectional shapes of the first doped regions 110" and the second doped regions 120' are shown as rectangles, but the present invention is not limited thereto.

Figure 2:
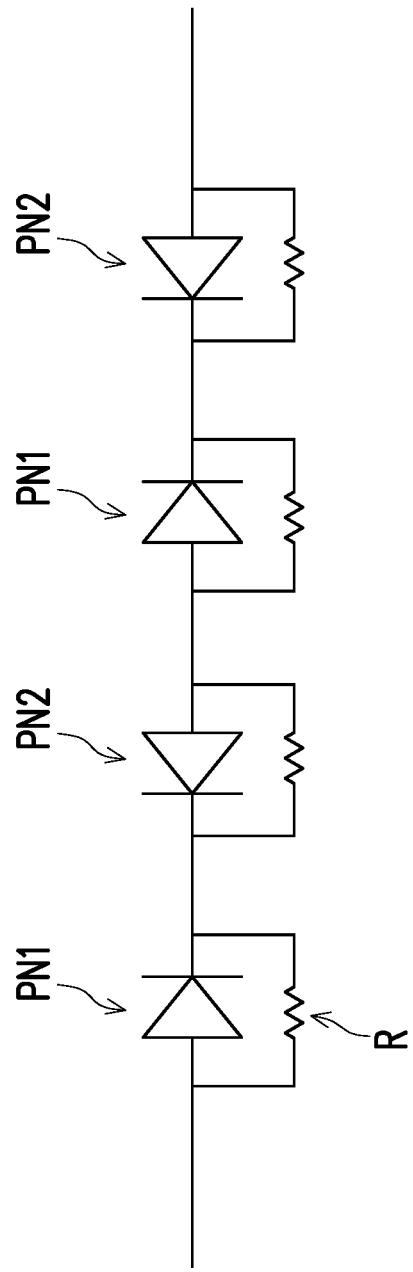
FIG. 2 is an equivalent circuit diagram of the wafer of FIG. 1F

In this embodiment, since the first doped regions 110" and the second doped regions 120' are alternately arranged in the semiconductor substrate 100, the semiconductor substrate 100 has the forward diodes PN1 and the reverse diodes PN2 alternately arranged, as shown in FIG. 2.

The forward diodes PN1 and the reverse diodes PN2 are alternately arranged to restrict the movement of electrons, thereby improving the quality of the components and enhancing the stability of the components.

Referring to FIG. 1F and FIG. 2, in the horizontal direction HD, the second doped regions 120' are in contact with the first doped regions 110" and the intrinsic semiconductor region i. Therefore, both of the forward diodes PN1 and the reverse diodes PN2 can connect in parallel to the resistor R, the resistor R is formed by the intrinsic semiconductor region i.

Based on the above, this embodiment can reduce the energy used in the first ion implantation process P1 and the energy used in the second ion implantation process P2, thereby improving the problem that the first ion implantation process P1 and the second ion implantation process P2 damage the first surface S1 of the semiconductor substrate 100. In addition, the first doped regions 110" and the second doped regions 120' are alternately arranged to restrict the movement of electrons, thereby improving the quality of the components and enhancing the stability of the components. In the general semiconductor processes, before forming the epitaxial layer on the semiconductor substrate, the whole surface or part of the semiconductor substrate is usually lightly doped or heavily doped, so as to prevent the elements in the subsequently formed epitaxial layer from diffusing into the semiconductor substrate and causing current leakage. Different from the general semiconductor processes, in the embodiment of the present invention, the first N-type doped regions 110' and the second N-type doped regions 120 with different doping levels are alternately arranged (as shown in FIG. 1F). Therefore, a doping concentration smaller than the doping concentration using in the general light doping process and the general heavy doping process may selectively been adopted in the first N-type doped regions 110' and the second N-type doped regions 120, so as to subsequently obtain a structure (alternating arrangement of the first doped regions 110" and the second doped regions 120') that can restrict the movement of electrons, thereby reducing the damage to the surface of the semiconductor substrate caused by the doping process.

Figure 3:
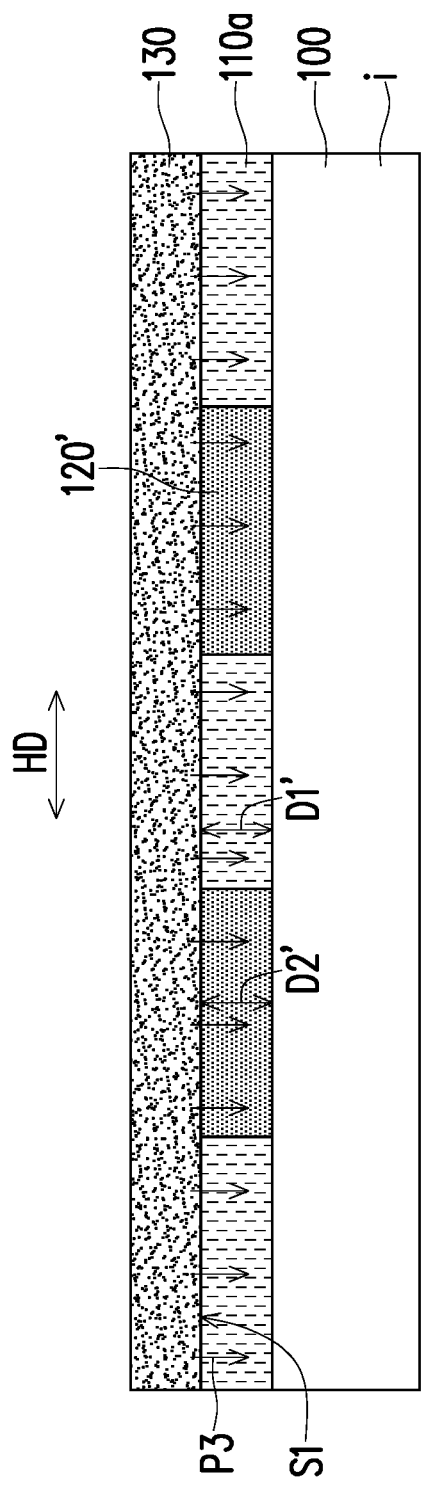
FIG. 3 is a schematic cross-sectional view of a manufacturing method of a wafer according to an embodiment of the present invention.

FIG. 3 is a schematic cross-sectional view of a manufacturing method of a wafer according to an embodiment of the present invention.

It should be noted herein that, in embodiments provided in FIG. 3, element numerals and partial content of the embodiments provided in FIG. 1A to FIG. 1F are followed, the same or similar reference numerals being used to represent the same or similar elements, and description of the same technical content being omitted. For a description of an omitted part, reference may be made to the foregoing embodiment, and the descriptions thereof are omitted herein.

The difference between the embodiment of FIG. 3 and the embodiment of FIG. 1F is that the depth D1' of the first doped regions 110" is smaller than the depth D2' of the second doped regions 120' in FIG. 1F, while the depth D1' of the first doped regions 110a is equal to the depth D2' of the second doped regions 120' in FIG. 3.

Referring to FIG. 3, in this embodiment, in the horizontal direction HD, the second doped regions 120' are in contact with the first doped regions 110a, and the second doped regions 120' are not in contact with the intrinsic semiconductor region i.

Figure 4:
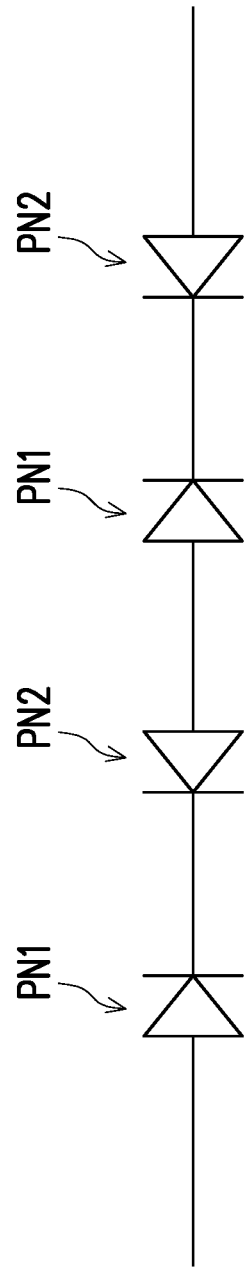
FIG. 4 is an equivalent circuit diagram of the wafer of FIG. 3

In this embodiment, since the first doped regions 110a and the second doped regions 120' are alternately arranged in the semiconductor substrate 100, the semiconductor substrate 100 has the forward diodes PN1 and the reverse diodes PN2 alternately arranged, as shown in FIG. 4.

The forward diodes PN1 and the reverse diodes PN2 are alternately arranged to restrict the movement of electrons, thereby improving the quality of the components and enhancing the stability of the components.

Based on the above, this embodiment can reduce the energy used in the first ion implantation process and the energy used in the second ion implantation process, thereby improving the problem that the first ion implantation process and the second ion implantation process damage the first surface S1 of the semiconductor substrate 100. In addition, the first doped regions 110a and the second doped regions 120' are alternately arranged to restrict the movement of electrons, thereby improving the quality of the components and enhancing the stability of the components.

Figure 5A:
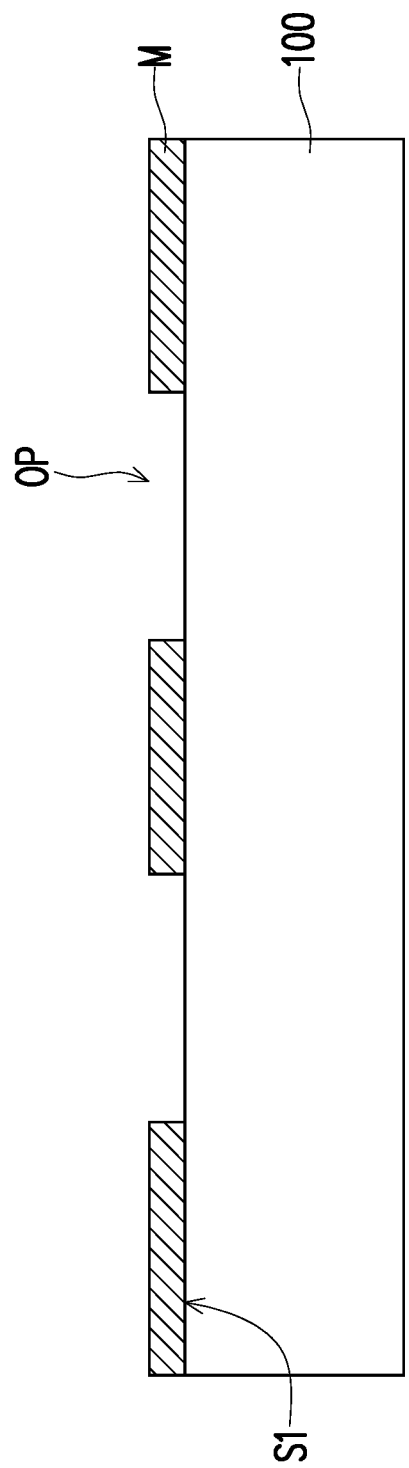
FIG. 5A to FIG. 5C are schematic cross-sectional views of a manufacturing method of a wafer according to an embodiment of the present invention.
Figure 5B:
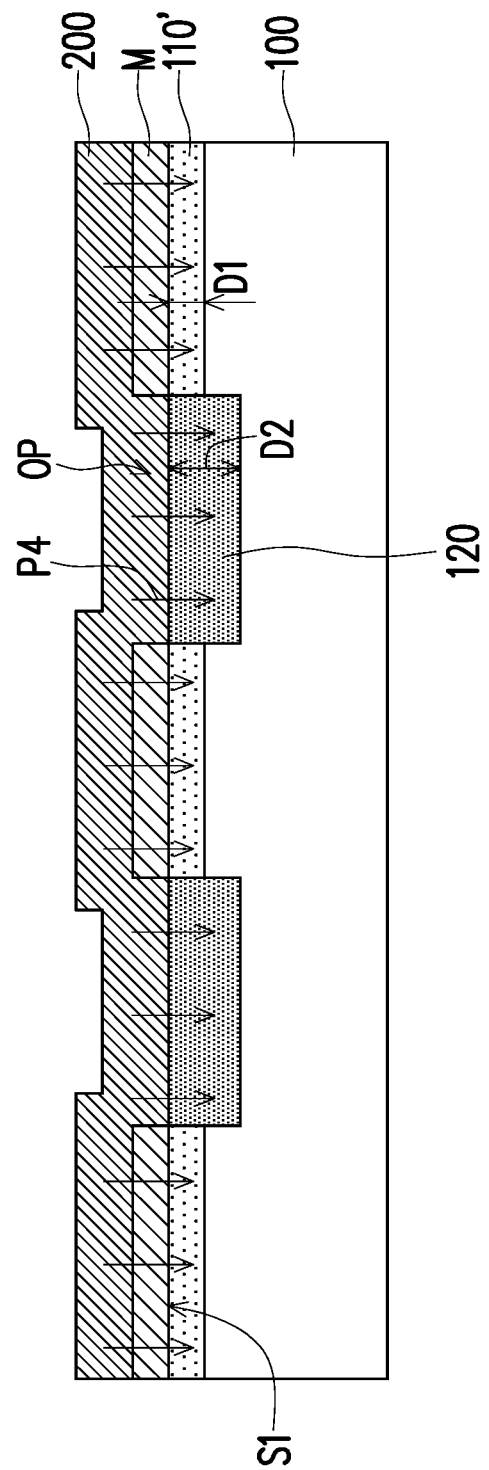
Figure 5C:
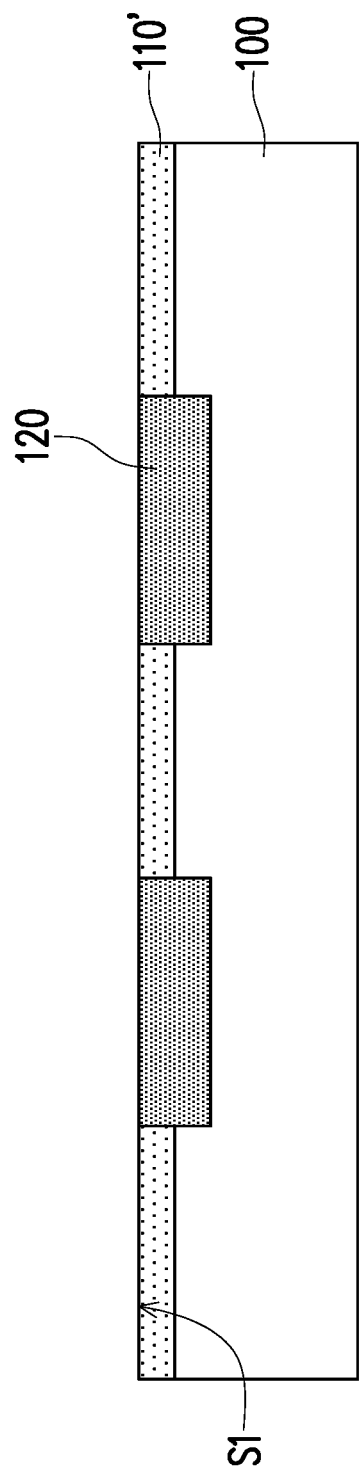

FIG. 5A to FIG. 5C are schematic cross-sectional views of a manufacturing method of a wafer according to an embodiment of the present invention.

It should be noted herein that, in embodiments provided in FIG. 5A to FIG. 5C, element numerals and partial content of the embodiments provided in FIG. 1A to FIG. 1F are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 5A, a semiconductor substrate 100 is provided. The semiconductor substrate 100 is, for example, a silicon substrate or other semiconductor substrates suitable for an epitaxial process. In some embodiments, the first surface S1 of the semiconductor substrate 100 is a ground and polished flat surface, thereby improving the yield of subsequent processes.

A barrier layer M is formed on the first surface S1 of the semiconductor substrate 100, and the barrier layer M has a plurality of openings OP exposing the first surface S1.

Referring to FIG. 5B, an N-type doping material layer 200 is formed on the barrier layer M and in the openings OP.

The N-type doping material layer 200 is heated to drive N-type dopants in the N-type doping material layer 200 diffusing into the semiconductor substrate 100. In some embodiments, the N-type dopant is, for example, phosphorus, arsenic, antimony, or other suitable element.

Part of the N-type dopants diffuse into the semiconductor substrate 100 from the N-type doping material layer 200 after passing through the barrier layer M to define a plurality of first N-type doped regions 110', and another part of the N-type dopants directly diffuse into the semiconductor substrate 100 from the N-type doping material layer 200 to define a plurality of second N-type doped regions 120.

The first N-type doped regions 110' and the second N-type doped regions 120 are in contact with each other. The first N-type doped regions 110' are overlapping with the barrier layer M, and the second N-type doped regions 120 are located below the openings OP. The first N-type doped regions 110' and the second N-type doped regions 120 are alternately arranged.

Both of the first N-type doped regions 110' and the second N-type doped regions 120 contain N-type dopants. Both of the first N-type doped regions 110' and the second N-type doped regions 120 are N-type semiconductors.

Since the barrier layer M reduces the diffusion of N-type dopants into the semiconductor substrate 100, the doping concentration of the N-type dopants in each of the first N-type doped regions 110' is not greater than the doping concentration of the N-type dopants in each of the second N-type doped regions 120. In some embodiments, the doping concentration of the first N-type doped regions 110' is $10^{13}$ cm$^{-3}$ to $10^{17}$ cm$^{-3}$, preferably $10^{13}$ cm$^{-3}$ to $10^{15}$ cm$^{-3}$, more preferably $10^{13}$ cm$^{-3}$ to $10^{14}$ cm$^{-3}$. In some embodiments, the doping concentration of the second N-type doped regions 120 is $10^{16}$ cm$^{-3}$ to $10^{21}$ cm$^{-3}$, preferably $10^{16}$ cm$^{-3}$ to $10^{19}$ cm$^{-3}$, more preferably $10^{16}$ cm$^{-3}$ to $10^{18}$ cm$^{-3}$.

In some embodiments, the depth D2 of the second N-type doped regions 120 is less than or equal to 5 μm, less than or equal to 2 μm, or less than or equal to 1 μm, and the depth D1 of the first N-type doped regions 110' is 1% to 50% of the depth D2 of the deepest second N-type doped region 120, 1% to 25% of the depth D2 of the deepest second N-type doped region 120, or 1% to 10% of the depth D2 of the deepest second N-type doped region 120.

In the present embodiment, the semiconductor substrate 100 includes the first N-type doped regions 110' with the same depth and the second N-type doped regions 120 with the same depth, but the present invention is not limited thereto. In other embodiments, the semiconductor substrate 100 includes the first N-type doped regions 110' with different depths and the second N-type doped regions 120 with different depths.

Referring to FIG. 5C, the barrier layer M and the N-type doping material layer 200 are removed. After removing the barrier layer M and the N-type doping material layer 200, the process shown in FIG. 1F can be performed to form the first doped regions 110" and the second doped regions 120'. The related descriptions can refer to FIG. 1F and the corresponding description thereof, and are omitted herein.

Based on the above, the first doped regions (as shown in FIG. 1F) and the second doped regions (as shown in FIG. 1F) are alternately arranged to restrict the movement of electrons, thereby improving the quality of the components and enhancing the stability of the components.

FIG. 6 is a schematic top view of a wafer of an embodiment according to the present invention, wherein the epitaxial layer is omitted in FIG. 6.

For the manufacturing method of the wafer in FIG. 6, reference may be made to the embodiment of FIG. 1A to FIG. 1F or the embodiment of FIG. 5A to FIG. 5C.

Referring to FIG. 6, in this embodiment, the first doped regions 110" and the second doped regions 120' are alternately arranged and are both rectangular.

Figure 7:
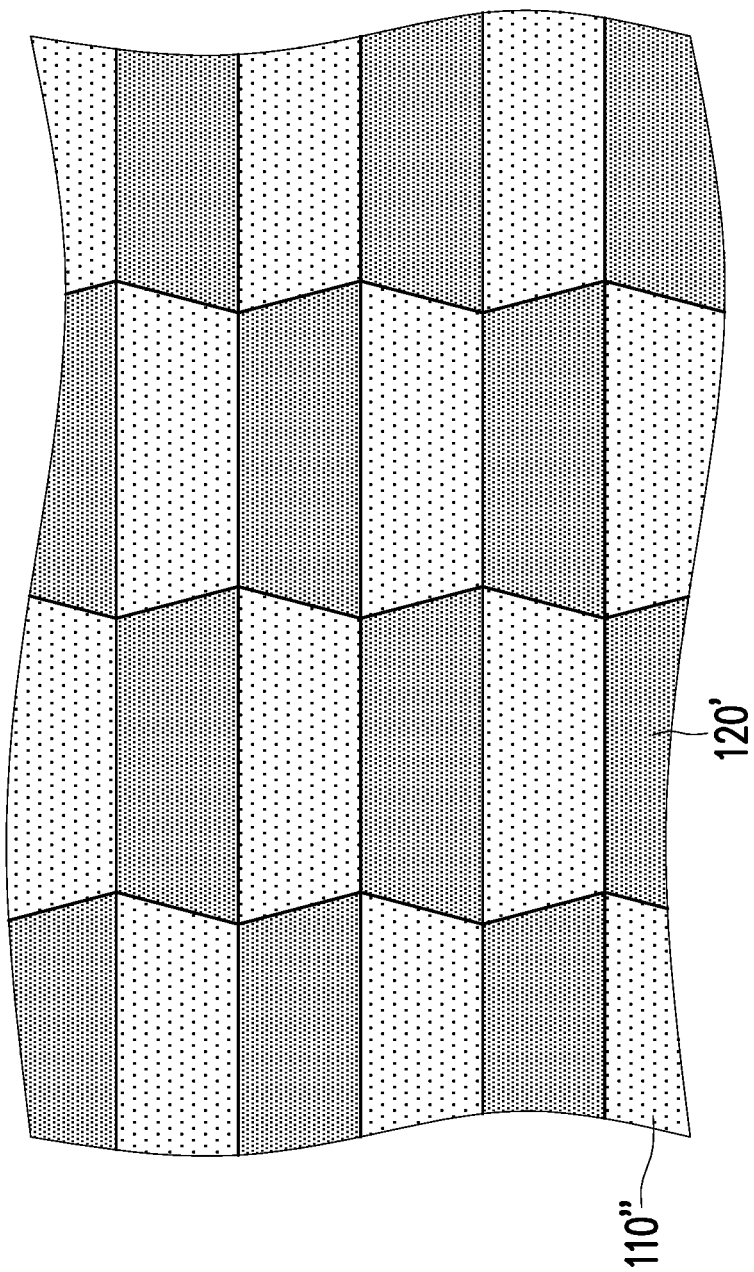
FIG. 7 is a schematic top view of a wafer of an embodiment according to the present invention.

FIG. 7 is a schematic top view of a wafer of an embodiment according to the present invention, wherein the epitaxial layer is omitted in FIG. 7.

For the manufacturing method of the wafer in FIG. 7, reference may be made to the embodiment of FIG. 1A to FIG. 1F or the embodiment of FIG. 5A to FIG. 5C.

Referring to FIG. 7, in this embodiment, the first doped regions 110" and the second doped regions 120' are alternately arranged and are both trapezoidal.

Figure 8:
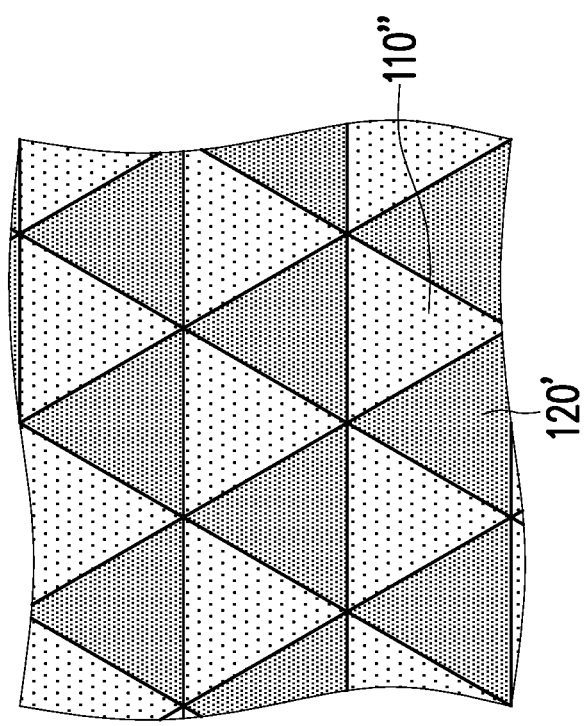
FIG. 8 is a schematic top view of a wafer of an embodiment according to the present invention.

FIG. 8 is a schematic top view of a wafer of an embodiment according to the present invention, wherein the epitaxial layer is omitted in FIG. 8.

For the manufacturing method of the wafer in FIG. 8, reference may be made to the embodiment of FIG. 1A to FIG. 1F or the embodiment of FIG. 5A to FIG. 5C.

Referring to FIG. 8, in this embodiment, the first doped regions 110' and the second doped regions 120' are alternately arranged and are both triangular.

Figure 9A:
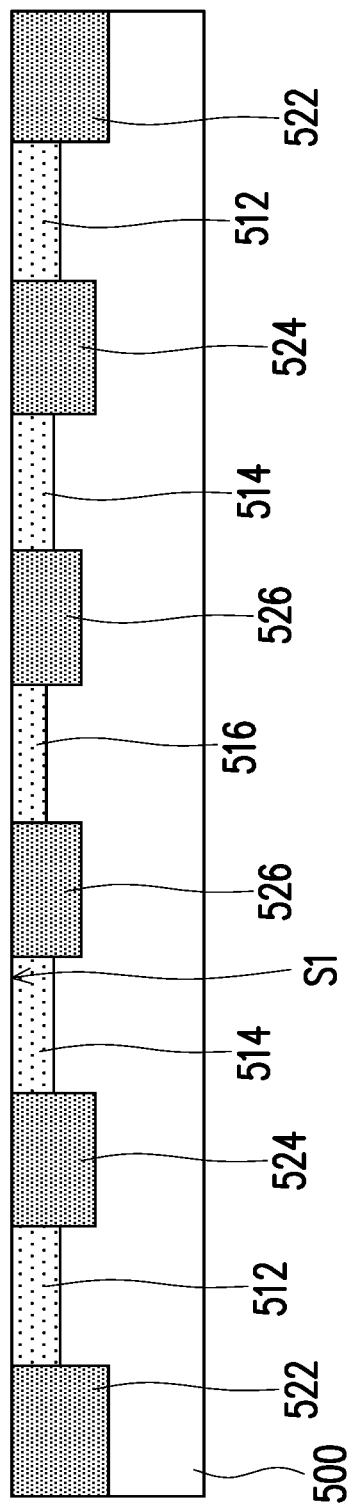
FIG. 9A to FIG. 9B are schematic cross-sectional views of a manufacturing method of a wafer according to an embodiment of the present invention.
Figure 9B:
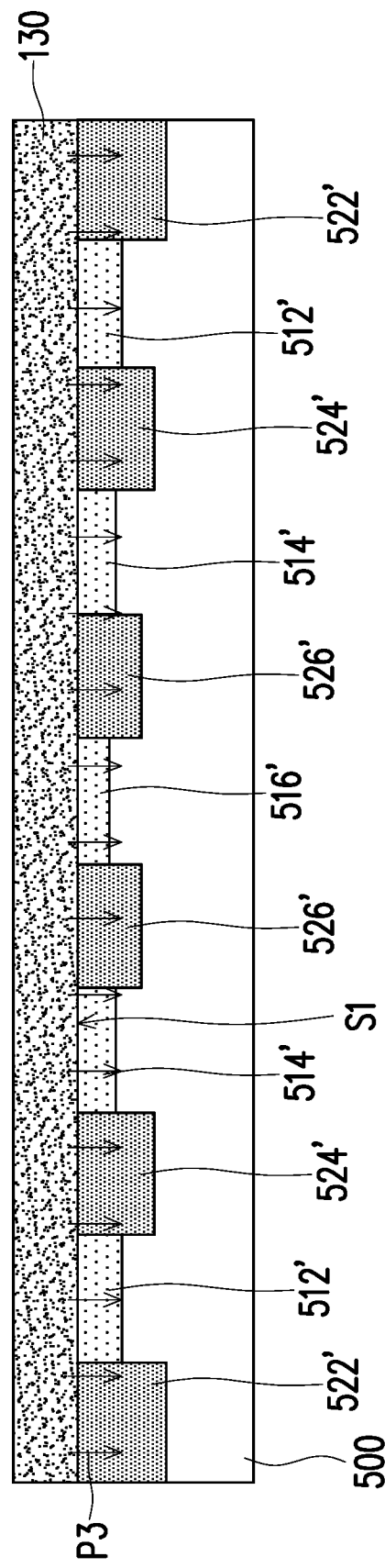

FIG. 9A to FIG. 9B are schematic cross-sectional views of a manufacturing method of a wafer according to an embodiment of the present invention.

Referring to FIG. 9A, first N-type doped regions 512, 514 and 516 and second N-type doped regions 522, 524 and 526 are formed in the semiconductor substrate 500. In this embodiment, the first N-type doped regions 512 have the same depth, the first N-type doped regions 514 have the same depth, and the first N-type doped regions 516 have the same depth, but the present invention is not limited thereto. In this embodiment, the second N-type doped regions 522 have the same depth, the second N-type doped regions 524 have the same depth, and the second N-type doped regions 526 have the same depth, but the present invention is not limited thereto.

The first N-type doped regions 512, 514, 516 and the second N-type doped regions 522, 524, 526 are alternately arranged. Both of the first N-type doped regions 512, 514, 516 and the second N-type doped regions 522, 524, 526 contain N-type dopants, and the doping concentration of the N-type dopants in each of the first N-type doped regions 512, 514, 516 is not greater than the doping concentration of the N-type dopants in each of the second N-type doped regions 522, 524 and 526.

In some embodiments, the method of forming the first N-type doped regions 512, 514, 516 and the second N-type doped regions 522, 524, 526 includes ion implantation process, thermal diffusion process, or other similar methods.

In some embodiments, the depths of the first N-type doped regions 512, 514, 516 are different from each other, and the depths of the second N-type doped regions 522, 524, 526 are different from each other. The depths of the second N-type doped regions 522, 524 and 526 are greater than the depths of the adjacent first N-type doped regions 512, 514 and 516.

In some embodiments, the first N-type doped regions 512, 514, 516 include different doping concentrations. For example, the doping concentration of the first N-type doped region 512 is greater than the doping concentration of the first N-type doped region 514, and the doping concentration of the first N-type doped region 514 is greater than the doping concentration of the first N-type doped region 516, but the present invention is not limited thereto. In some embodiments, the second N-type doped regions 522, 524, 526 include different doping concentrations. For example, the doping concentration of the second N-type doped region 522 is greater than the doping concentration of the second N-type doped region 524, and the doping concentration of the second N-type doped region 524 is greater than the doping concentration of the second N-type doped region 526, but the present invention is not limited thereto.

In some embodiments, the difference between the doping concentrations of the first N-type doped regions 512, 514, 516 is not more than 10%, and the difference between the doping concentrations of the second N-type doped regions 522, 524, 526 is not more than 10%.

Referring to FIG. 9B, the epitaxial layer 130 is formed on the first N-type doped regions 512, 514, 516 and the second N-type doped regions 522, 524, 526, and a doping process P3 is performed on the first N-type doped regions 512, 514, 516 and the second N-type doped regions 522, 524, and 526. Part of elements (P-type dopants) in the epitaxial layer 130 diffuse into the first N-type doped regions 512, 514, 516 and the second N-type doped regions 522, 524, 526 to respectively form the first doped regions 512', 514', 516' and the second doped regions 522', 524', 526'. In this embodiment, the first doped regions 512', 514', and 516' are P-type semiconductors, and the second doped regions 522', 524', and 526' are N-type semiconductors.

In some embodiments, at different positions of the first surface S1 of the semiconductor substrate 500, the doping process P3 may be uneven due to uneven process temperature, uneven thickness of the epitaxial layer 130 or other factors. By providing the first N-type doped regions 512, 514, 516 with different depths, the depths of the P-type semiconductors (the first doped regions 512', 514', 516') can be better controlled.

In some embodiments, the P-type dopants in the epitaxial layer 130 may diffuse into semiconductor substrate 500 by heating. In some embodiments, the surface of the semiconductor substrate 500 may have a problem of uneven heat distribution, for example, the temperature of the portion of the semiconductor substrate 500 close to the heat source is higher than the temperature of the portion of the semiconductor substrate 500 far from the heat source. Therefore, the degrees of diffusion of P-type dopants in different regions of the semiconductor substrate 500 may be different. Based on this, the first N-type doped region 512 with higher doping concentration is disposed in the portion where the diffusion of more P-type dopants is expected (i.e., the portion closer to the heat source), and the first N-type doped region 516 with lower doping concentration is disposed in the portion where the diffusion of less P-type dopants is expected (i.e., the portion farther away from the heat source), so that the depth and conductivity of the P-type semiconductors (the first doped regions 512', 514', 516') formed subsequently can be better controlled, so as to further enhance the stability of the components. Similarly, the second N-type doped region 522 with higher doping concentration is disposed in the portion where the diffusion of more P-type dopants is expected (i.e., the portion closer to the heat source), and the second N-type doped region 526 with lower doping concentration is disposed in the portion where the diffusion of less P-type dopants is expected (i.e., the portion farther away from the heat source), thereby making the N-type semiconductors (the second doped regions 522', 524', 526') formed subsequently to match the P-type semiconductors (the first doped regions 512', 514', 516'). With such a design, the doping concentration can be reduced in the portion where the diffusion of less P-type dopant is expected, and the damage to the surface of the semiconductor substrate 500 by the doping process can be reduced. However, it should be noted that the position of the semiconductor substrate 500 close to the heat source may be changed due to different heating tools or different placement of the semiconductor substrate 500. Therefore, the present invention does not specifically limit the arrangement and order of the first N-type doped regions 512, 514, 516 and the second N-type doped regions 522, 524, 526. The arrangement and order of the first N-type doped regions 512, 514, 516 and the second N-type doped regions 522, 524, 526 can be adjusted according to actual needs.

Based on the above, the first doped regions 512', 514', 516' and the second doped regions 522', 524', 526' are alternately arranged to restrict the movement of electrons, thereby improving the quality of the components and enhancing the stability of the components.

Figure 10A:
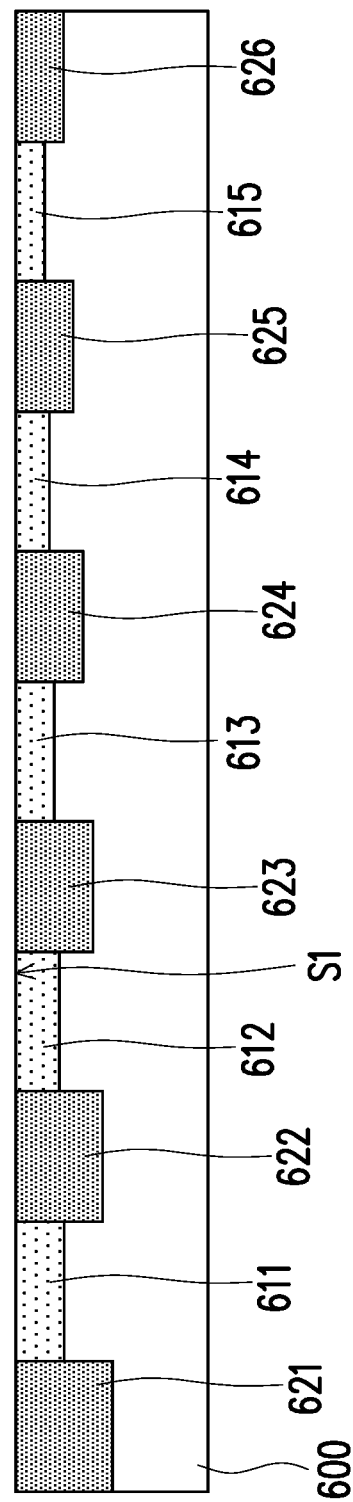
FIG. 10A to FIG. 10B are schematic cross-sectional views of a manufacturing method of a wafer according to an embodiment of the present invention.
Figure 10B:
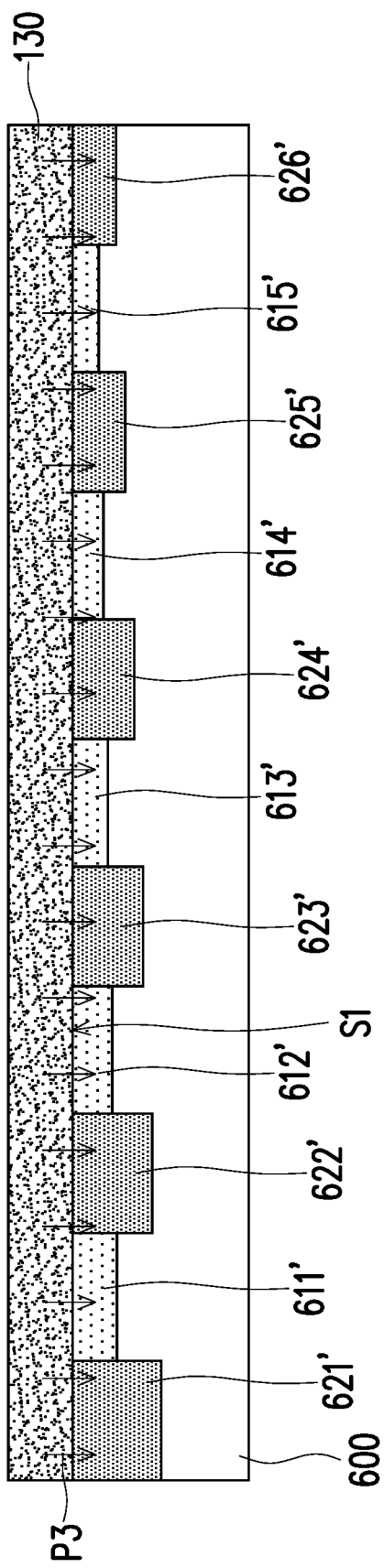

FIG. 10A to FIG. 10B are schematic cross-sectional views of a manufacturing method of a wafer according to an embodiment of the present invention.

It should be noted herein that, in embodiments provided in FIG. 10A to FIG. 10B, element numerals and partial content of the embodiments provided in FIG. 9A to FIG. 9B are followed, the same or similar reference numerals being used to represent the same or similar elements, and description of the same technical content being omitted. For a description of an omitted part, reference may be made to the foregoing embodiment, and the descriptions thereof are omitted herein.

The difference between the embodiment of FIG. 10A to FIG. 10B and the embodiment of FIG. 9A to FIG. 9B is that: in the embodiment of FIG. 9A to FIG. 9B, the depths of the first doped regions 512', 514', 516' and the second doped regions 522', 524', 526' are gradually decreasing from the edge of the semiconductor substrate 500 to the center of the semiconductor substrate 500; in the embodiment of FIG. 10A to FIG. 10B, the depths of the first doped regions 611', 612', 613', 614', 615' and the second doped regions 621', 622', 623', 624', 625', 626' are gradually decreasing from one side of the semiconductor substrate 600 to the other side of the semiconductor substrate 600.

Referring to FIG. 10A, the first N-type doped regions 611, 612, 613, 614, and 615 and the second N-type doped regions 621, 622, 623, 624, 625, and 626 are formed in the semiconductor substrate 600.

The first N-type doped regions 611, 612, 613, 614, 615 and the second N-type doped regions 621, 622, 623, 624, 625, 626 are alternately arranged. Both of the first N-type doped regions 611, 612, 613, 614, 615 and the second N-type doped regions 621, 622, 623, 624, 625, 626 contains N-type dopants, and the doping concentration of the N-type dopants in each of the first N-type doped regions 611, 612, 613, 614, and 615 is not greater than the doping concentration of the N-type dopants in each of the second N-type doped regions 621, 622, 623, 624, 625, and 626.

In some embodiments, a method for forming the first N-type doped regions 611, 612, 613, 614, 615 and the second N-type doped regions 621, 622, 623, 624, 625, 626 includes ion implantation process, thermal diffusion process or other similar method.

In some embodiments, the first N-type doped regions 611, 612, 613, 614, 615 include different doping concentrations. For example, the doping concentrations of the first N-type doped regions 611, 612, 613, 614, and 615 are sequentially decreasing, but the present invention is not limited thereto. In some embodiments, the second N-type doped regions 621, 622, 623, 624, 625, 626 include different doping concentrations. For example, the doping concentrations of the second N-type doped regions 621, 622, 623, 624, 625, and 626 are sequentially decreasing, but the present invention is not limited thereto.

In some embodiments, the difference between the doping concentrations of the first N-type doped regions 611, 612, 613, 614, 615 is not more than 10%, and the difference between the doping concentrations of the second N-type doped regions 621, 622, 623, 624, 625, 626 is not more than 10%.

Referring to FIG. 10B, the epitaxial layer 130 is formed on the first N-type doped regions 611, 612, 613, 614, 615 and the second N-type doped regions 621, 622, 623, 624, 625, 626. A doping process P3 is performed on the first N-type doped regions 611, 612, 613, 614, 615 and the second N-type doped regions 621, 622, 623, 624, 625, 626. Part of the elements (P-type dopants) in the epitaxial layer 130 diffuse into the first N-type doped regions 611, 612, 613, 614, 615 and the second N-type doped regions 621, 622, 623, 624, 625, 626, so as to respectively form the first doped regions 611', 612', 613', 614', 615' and the second doped regions 621', 622', 623', 624', 625', 626'. In this embodiment, the first doped regions 611', 612', 613', 614', 615' are P-type semiconductors, and the second doped regions 621', 622', 623', 624', 625', 626' are N type semiconductors.

In some embodiments, at different positions of the first surface S1 of the semiconductor substrate 600, the doping process P3 may be uneven due to uneven process temperature, uneven thickness of the epitaxial layer 130 or other factors. By making the depths of the first N-type doped regions 611, 612, 613, 614, 615 different, the depth of the P-type semiconductors (the first doped regions 611', 612', 613', 614', 615') can be better controlled.

Based on the above, the first doped regions 611', 612', 613', 614', 615' and the second doped regions 621', 622', 623', 624', 625', 626' are alternately arranged to restrict the movement of electrons, thereby improving the quality of the components and enhancing the stability of the components.

What is claimed is:

1. A wafer, comprising:
   a semiconductor substrate, comprising:
      first doped regions, located on a first surface of the semiconductor substrate;
      second doped regions, located on the first surface of the semiconductor substrate and in contact with the first doped regions, wherein the first doped regions and the second doped regions are alternately arranged, wherein both of the first doped regions and the second doped regions comprise N-type dopants, and a doping concentration of the N-type dopants in each of the first doped regions is not greater than a doping concentration of the N-type dopants in each of the second doped regions; and
      an epitaxial layer, located on the first doped regions and the second doped regions, wherein the first doped regions and the second doped regions further comprises P-type dopants, and the epitaxial layer contains an element the same as the P-type dopants.

2. The wafer of claim 1, wherein both of the first doped regions and the second doped regions are N-type semiconductors, wherein a depth of each of the first doped regions is not greater than a depth of an adjacent second doped region.

3. The wafer of claim 1, wherein:
   a doping concentration of the P-type dopants in the first doped regions is greater than the doping concentration of the N-type dopants in the first doped regions, and the first doped regions are P-type semiconductors; and
   the doping concentration of the N-type dopants in the second doped regions is greater than a doping concentration of the P-type dopants in the second doped regions, and the second doped regions are N-type semiconductors, wherein a depth of each of the first doped regions is not greater than a depth of an adjacent second doped region.

4. The wafer of claim 1, wherein the semiconductor substrate further comprises:
   an intrinsic semiconductor region, located below bottoms of the first doped regions and the second doped regions, wherein the second doped regions are in contact with the first doped regions and the intrinsic semiconductor region in a horizontal direction, wherein the horizontal direction is parallel to the first surface.

5. The wafer of claim 1, wherein the first doped regions comprise different doping concentrations, and the second doped regions comprise different doping concentrations.

6. The wafer of claim 5, wherein the difference between the doping concentrations of the first doped regions is not more than 10%, and the difference between the doping concentrations of the second doped regions is not more than 10%.

7. A manufacturing method of a wafer, comprising:
provide a semiconductor substrate;
performing a first ion implantation process on a first surface of the semiconductor substrate to form an N-type lightly doped region in the semiconductor substrate;
forming a barrier layer on the first surface of the semiconductor substrate, and the barrier layer has openings exposing the N-type lightly doped region;
using the barrier layer as a mask to perform a second ion implantation process on the N-type lightly doped region of the semiconductor substrate to form first N-type doped regions and second N-type doped regions, wherein the first N-type doped regions and the second N-type doped regions are in contact with each other, wherein the first N-type doped regions and the second N-type doped regions are alternately arranged, wherein both of the first N-type doped regions and the second N-type doped regions comprise N-type dopants, and a doping concentration of the N-type dopants in each of the first N-type doped regions is not greater than a doping concentration of the N-type dopants in each of the second N-type doped regions;
removing the barrier layer; and
forming an epitaxial layer on the first N-type doped regions and the second N-type doped regions, wherein part of elements in the epitaxial layer diffuse into the first N-type doped regions and the second N-type doped regions, and at least part of the first N-type doped regions are converted into P-type semiconductors.

8. The manufacturing method of the wafer of claim 7, wherein a depth of the P-type semiconductors is not greater than a depth of the second N-type doped regions.

9. A manufacturing method of a wafer, comprising:
providing a semiconductor substrate;
forming a barrier layer on a first surface of the semiconductor substrate, and the barrier layer has openings exposing the first surface;
forming an N-type doping material layer on the barrier layer and in the openings;
heating the N-type doping material layer to drive N-type dopants in the N-type doping material layer diffusing into the semiconductor substrate, wherein:
part of the N-type dopants diffuse into the semiconductor substrate from the N-type doping material layer after passing through the barrier layer to define first N-type doped regions; and
another part of the N-type dopants directly diffuse into the semiconductor substrate from the N-type doping material layer to define second N-type doped regions, wherein the first N-type doped regions and the second N-type doped regions are alternately arranged, wherein both of the first N-type doped regions and the second N-type doped regions comprise the N-type dopants, and a doping concentration of the N-type dopants in each of the first N-type doped regions is not greater than a doping concentration of the N-type dopants in each of the second N-type doped regions;
removing the barrier layer and the N-type doping material layer; and
forming an epitaxial layer on the first N-type doped regions and the second N-type doped regions, wherein part of elements in the epitaxial layer diffuse into the first N-type doped regions and the second N-type doped regions, and at least part of the first N-type doped regions are converted into P-type semiconductors.

10. The manufacturing method of the wafer of claim 9, wherein a depth of the P-type semiconductors is not greater than a depth of the second N-type doped regions.

* * * * *